United States Patent [19]

Kaesz et al.

[11] Patent Number: 5,403,620
[45] Date of Patent: * Apr. 4, 1995

[54] CATALYSIS IN ORGANOMETALLIC CVD OF THIN METAL FILMS

[75] Inventors: Herbert D. Kaesz; Robert F. Hicks, both of Los Angeles, Calif.

[73] Assignee: Regents of The University of California, Oakland, Calif.

[*] Notice: The portion of the term of this patent subsequent to Jul. 14, 2009 has been disclaimed.

[21] Appl. No.: 959,384

[22] Filed: Oct. 13, 1992

[51] Int. Cl.$^6$ .............................. C23C 16/00
[52] U.S. Cl. ..................... 427/252; 427/123; 427/124; 427/255.2; 427/255.7; 427/554
[58] Field of Search ............ 427/123, 124, 554, 255.2, 427/255.7, 252

[56] References Cited

U.S. PATENT DOCUMENTS

| | | | |
|---|---|---|---|
| 3,622,367 | 11/1971 | Haag | 427/123 |
| 4,915,988 | 4/1990 | Erbil | 427/255.2 |
| 5,091,210 | 2/1992 | Mikoshiba | 427/124 |
| 5,130,172 | 7/1992 | Hicks | 427/252 |
| 5,154,949 | 10/1992 | Shindo | 427/255.2 |

OTHER PUBLICATIONS

Houle, F. A. et al., "Surface Processes Leading to Carbon Contamination of Photochemically Deposited Copper Films" Nov./Dec. 1986, A4(6)pp. 2452–2458, J. Vac Sci.

Gozum, John E. et al, "Tailored Organometallics as Precursors for the Chem. Vapor Deposition of High-Purity Palladium and Platinum Thin Films", 1988, pp. 2688–2689, J. Am. Chem. Soc vol 110, No. 8 (no month).

Kaplin, Yu A. et al. "Decomposition of Nickelocene in Presence of Hydrogen" Jan. 1980, pp. 118–121, UDC. 547.1' 174, c. 1980, Plenum Publishing Corp., translated from Zharnal Obshchei Khimir, 50, 118 (1980).

Egger, K. W., "Cyclopentadienyl-Metal Complexes II Mass Spectrometric and Gas Phase Kinetic Studies on the Thermal Stability and the Structure of (CH3)3PtC5H5", 24(1970) pp. 501–506, J. Organometallic Chemistry no month.

Miller, Timothy M. et al, "Heterogeneous, Platinum-Catalyzed Hydrogenation of (Diolofin)dialkylplatinum (II)Complexes: Kinetics", 1988, pp. 3146–3156, J. Amer Chem Soc vol 110 #10 no month.

*Primary Examiner*—Shrive Beck
*Assistant Examiner*—Vi Duong Dang
*Attorney, Agent, or Firm*—George F. Bethel; Patience K. Bethel

[57] ABSTRACT

A process for CVD including plasma enhanced and laser induced CVD using one or more precursor film forming metal compounds as the major film forming metal precursor, for example organotungsten, which is admixed with minor amounts of a precursor catalytic metal compound, for example, an organoplatinum compound, as a precursor to a catalytic metal in the presence of hydrogen gas to provide improved purity of deposited metal films having residual amounts of the catalytic metal incorporated therein.

25 Claims, 3 Drawing Sheets

FIG 3

Table I.

Atomic composition of films

| Depth (Å) | Tungsten (%) | | Platinum (%) | Carbon (%) | | Oxygen (%) | |
|---|---|---|---|---|---|---|---|
| | W[a] | W/Pt | W/Pt | W | W/Pt | W | W/Pt |
| 0 | 44.9 | 54.6 | 1.9 | 46.2 | 39.0 | 5.9 | 4.2 |
| 190 | 66.6 | 88.6 | 3.4 | 24.6 | 5.7 | 3.5 | 2.0 |
| 380 | 67.3 | 89.8 | 3.6 | 24.5 | 4.8 | 3.4 | 1.6 |
| 570 | 67.4 | 90.9 | 2.3 | 24.9 | 4.8 | 3.4 | 1.8 |
| 760 | 66.7 | 90.9 | 2.6 | 25.5 | 5.1 | 3.2 | 1.5 |
| 950 | 65.7 | 88.9 | 4.2 | 26.2 | 4.8 | 2.2 | 1.8 |
| 1140 | 63.3 | 90.1 | 3.3 | 26.1 | 4.7 | 1.2 | 1.7 |
| 1330 | 39.5 | 89.9 | 4.0 | 11.3 | 5.1 | 3.3 | 1.8 |
| 1520 | 15.3 | 89.3 | 3.6 | 4.6 | 5.1 | 5.6 | 1.8 |
| 1900 | | 89.2 | 4.1 | | 4.7 | | 1.8 |
| 2280 | | 88.1 | 4.1 | | 5.9 | | 1.7 |
| 2660 | | 84.1 | 5.2 | | 8.9 | | 1.7 |
| 3040 | | 73.6 | 10.2 | | 13.8 | | 2.2 |
| 3420 | | 58.3 | 15.2 | | 24.2 | | 2.1 |

[a]type of film.

CATALYSIS IN ORGANOMETALLIC CVD OF THIN METAL FILMS

BACKGROUND OF THE INVENTION

1. Field of the Invention

This invention relates to chemical vapor deposition (CVD) of thin metal films, and in particular to the catalyzed removal of heteroatoms during the deposition of metals from precursor film forming metal compounds in the presence of hydrogen.

2. Description of the Prior Art

The deposit of thin coatings of metals onto various substrates are important in several industries. For example, one of the most important applications is in the production of integrated circuits in the microelectronics industry. In this respect, one of the most important criteria is the purity of the deposited thin metal film. The presence of even small amounts of carbon, oxygen and other heteroatom contaminants can markedly affect the performance of the finished electronic component.

The term "heteroatom" as used herein and in the appended claims is meant to include all atoms except metal atoms.

Various methods have been used for purposes of depositing a thin metal coating onto a substrate including for example precipitation from liquid solution, sputtering, and chemical vapor deposition (CVD), and plasma enhanced CVD.

In addition to purity, it is often desirable to selectively deposit a metal film on a portion of the surface of a semiconductor or other electronic component. This is particularly the case for purposes of providing interconnects to various circuit elements which require selective deposition in small voids in the substrate surface of the electronic component.

The use of liquid solution precipitation of precursor compounds followed by metal deposition has some advantages. However, it has generally been unsatisfactory for purposes of complete and contiguous deposition since it is difficult to insure that the solution will penetrate the small voids which are necessary to insure film quality and proper adherence to the substrate. Additionally, the purity of the deposited coating is often not as high as is necessary for some commercial applications. Sputtering has also been rejected in many instances since the quality of the coating as well as the uniformity of the coating has often been less than commercially acceptable. Also, this method requires that the extra metal introduced be chemically etched away in subsequent treatments.

Chemical vapor deposition, has provided more uniform deposition of thin metal films and is more reliable for conformal coverage in the deposition of metal films on convoluted surfaces. Despite the advantages of CVD, the degree of purity of the deposited metal films has often been less than desired.

Chemical vapor deposition has produced films which have been contaminated with unacceptable levels of carbon and oxygen and other heteroatoms that are derived from decomposition of hydrocarbon and oxocarbon moieties of the volatile CVD precursor compounds.

These precursor compounds are typically organometallic compounds with hydrocarbon, carbonyl, and hydride ligands that are used in organometallic chemical vapor deposition processes (OMCVD).

For instance, the use of metal carbonyl compounds in CVD applications typically introduces carbon and oxygen contaminants. Localized laser heating at high temperatures of small deposited metal "dots" as shown by Houle et al in their work with deposited tungsten appears to essentially clean in the center with impurities on the periphery of the dot area.

The three major chemical processes for achieving CVD can be generally classified as reduction, thermal decomposition, and displacement.

Reduction involves exposing the volatile metal compound during or after deposition on the substrate to hydrogen or equivalent reducing gas. Theoretically, the hydrogen reacts with the nonmetal portion of the compound to yield volatile hydrocarbon byproducts and to leave the metal film behind on the substrate.

Thermal decomposition involves heating the substrate to cause the hydrocarbon portion of the volatile metal compound to decompose to volatile hydrocarbons and leave the surface of the substrate while leaving the metal on the surface.

Displacement involves use of a surface material or surface absorbed species on the substrate to react with the volatile metal compound to yield volatile byproducts and deposit metal on the exposed surface.

All of the above techniques suffer from the introduction of impurities during the decomposition reaction of the precursor metal compound or to produce corrosive byproducts in depositing the metal film.

In recent years, improved purity of thin metal films deposited by CVD involved the use of organometallics as the volatile compound. See Gozum, J. et al., "'Tailored' Organometallics as Precursors for the Chemical Vapor Deposition of High-Purity Palladium and Platinum Thin Films," *J. Am. Chem. Soc.*, 110, 2688 (1988).

In the above referenced article bis(allyl)palladium, bis(2-methylallyl)palladium, and (cyclopentadienyl)(allyl) palladium were investigated for CVD at 250° C. and $10^{-4}$ Torr. The cyclopentadienyl compound yielded CVD palladium films having about 5 mol % residual carbon as a contaminant. However, it was also found that at a similar temperature and pressure, the cyclopentadienyl complex $CPPtMe_3$[(cyclopentadienyl)(trimethyl)platinum(IV)] produced high quality platinum films that were not significantly contaminated with carbon. In some cases a large amount of carbon is incorporated by the process. For example, titanium carbide films have been deposited using tetraneopentyltitanium ($Ti[CH_2C(CH_3)_3]_4$) at approximately 350° C. The deposited Ti contained sufficient carbon to form a separate TiC phase.

Organometallic compounds have also been evaluated for other purposes. For example, in Egger, K., "Cyclopentadienyl-Metal Complexes II. Mass Spectrometric and Gas Phase Kinetic Studies on the Thermal Stability and the Structure of $(CH_3)_3Pt-C_5H_5$," *J. Organometallic Chemistry*, 24, 501 (1970), the structure of [cyclopentadienyl(trimethyl)platinum(IV)] was reported. The article concluded that the cyclopentadienyl group was $\pi$ bonded. Studies of the hydrogenation of (1,5 cyclooctadiene) dimethylplatinum has also been reported. Miller, T. et al., "Heterogeneous, Platinum-Catalyzed Hydrogenation of (Diolefin)dialkylplatinum(II) Complexes: Kinetics," *J. Am. Chem. Soc.*, 3146 (1988) (and two subsequent articles by the same author). Hydrogenation of nickelocene (($C_5H_5)_2Ni$) has also been reported. Kaplin, Y. et al., "Decomposition of Nickelocene in Presence of Hydrogen," UDC 547.1'174, c. 1980

Plenum Publishing Corp., translated from *Zhurnal Obshchei Khimii*, 50, 118 (1980). None of these articles, however, report any special benefits of using these compounds in CVD.

In our newly issued patent U.S. Pat. No. 5,130,172 there is described the low temperature deposition of organometallic compounds onto substrates. The process includes coating onto various substrates such as glass or silicon, at least one metal that can readily cycle between two oxidation states and that is also a hydrogenation catalyst capable of facilitating the hydrogenation of hydrocarbon ligands of precursor organometallic compounds. During the process the substrate is maintained at a relatively low temperature in the range of about room temperature up to about 190° C. depending on the substrate.

The precursor organometallic compound of our patent which is vaporized or dissolved has the general formula $$L_nMR_m$$

wherein L is hydrogen, ethylene, allyl, methylallyl, butadienyl, pentadienyl, cyclopentadienyl, methycyclopentadienyl, cyclohexadienyl, hexadienyl, cycloheptatrienyl, or derivatives of said compounds having at least one alkyl side chain having less than five carbon atoms, M is a metal which can readily cycle between two oxidation states and can catalyze hydrogenation of hydrocarbon ligands of the organometallic compound such as cobalt, rhodium, iridium, nickel, palladium, platinum, osmium, ruthenium.

R is methyl, ethyl, propyl, or butyl, n is a number from 0 to the valence of said metal, m is a number from 0 to the valence of the metal, and m plus n must equal the valence of the metal.

During the process the substrate is continuously exposed to hydrogen gas and the organometallic compound at a temperature in the range of about room temperature to about 190° C. depending on the organometallic compound. During the course of reaction, a layer of the metal from the organometallic compound is deposited on the surface of the substrate which at the same time catalytically hydrogenates the hydrocarbon ligand of the organometallic compound to provide significant purity of the deposited metal compared with prior art processes. In the above process, the best results were obtained using $CpPtMe_3$ or $MeCpPtMe_3$.

A particular advantage of the process is that in most cases the process takes place at a relatively low temperature and the carbon impurity can be kept as low as 3.5 mol % or less.

However, following the above process using a heated substrate of, for example, silicon or glass and an organometallic compound wherein the metal is comprised of a refractory metal such as tungsten and in the presence of hydrogen gas, it has been found that the deposited tungsten metal is contaminated significantly with carbon, as much as 30 mol % to 40 mol % depending on the reaction conditions. Thus, the presence of the hydrogen reducing gas is insufficient in the case of tungsten organometallics to prevent the contamination of the deposited tungsten film with carbon.

Thus, it is an object of the invention to provide a method for depositing metal films, and especially tungsten metal films by both liquid and gas phase CVD. Such metal films contain significantly reduced heteroatom contaminants than hitherto possible. As used herein and in the appended claims the term "liquid CVD" refers to use of a solution deposited precursor compound in the CVD process.

It is a further object of the invention to provide a thin metal film, especially tungsten having up to 5-10 mol % of another catalytic metal such as platinum, and other Group VIII transition metals such as ruthenium, osmium, cobalt, rhodium, iridium, nickel, and palladium.

It is a further object of the invention to provide a process for the deposit of tungsten and/or other metals having dissolved therein or alloyed with, or heterogeneously admixed, one or more of the above catalytic metals.

It is also an object of the invention to provide a process wherein tungsten and/or other metals can be deposited on a substrate from precursor film forming metal compounds and the purity improved by including precursor catalytic metal compounds which catalyze the removal of carbon from the deposited tungsten and other metal films and at the same time remain as a dissolved portion of the tungsten or other metal films, or at the metal surface or at grain boundaries.

It is a further object of the invention to provide a process for controlling the amount of heteroatom such as carbon in the deposit of metal films in which one precursor would introduce carbon during metal deposition while another precursor would deposit the pure metal. Such depositions can be simultaneous or sequential.

It is another object of the invention to provide metal films comprising a mixture of two metals with up to 10 mol % of a catalytic metal.

It is a further object of the invention to provide a method for the laser induced deposition of pure metal films using precursor film forming metal compounds and precursor catalytic metal compounds in the presence of hydrogen gas wherein the laser beam is directed on the substrate at an incident angle ranging from perpendicular to parallel.

It is also an object of the invention to provide a process for deposition of pure metals from precursor film forming metal compounds in the presence of precursor catalytic metal compounds and hydrogen gas wherein the precursor catalytic metal compound is first deposited on the substrate from a solvent solution followed by evaporation and thermal decomposition to leave the catalytic metal on the substrate, followed by CVD deposition of a metal from precursor film forming metal compounds in the presence of hydrogen gas. The above process is referred to herein and in the claims as "liquid CVD".

It is also an object of the invention to provide processes for the deposition of pure metal films onto substrates by various combinations of gas CVD and liquid CVD processes using precursor film forming metal compounds and precursor catalytic metal compounds in the presence of hydrogen gas.

It is also an object of the invention to selectively deposit metals onto a substrate using precursor film forming metal compounds and catalytic amounts of a precursor catalytic metal compound in the presence of hydrogen gas. In this manner, the process can be used to provide a patterned deposition of metals either from the gas phase deposition, either sequentially or simultaneously or by the liquid phase deposition of precursor compounds to deposit either the metals or catalytic metals or both or all sequentially or simultaneously.

SUMMARY OF THE INVENTION

The invention includes the deposition of a thin layer of tungsten and other metals onto a substrate with greatly improved purity levels.

The process includes using one or more precursor film forming metal compound as the major film forming metal precursor, for example organotungsten, which is admixed with minor amounts of a precursor catalytic metal compound, for example, an organoplatinum compound, as a precursor to a catalytic metal in the presence of hydrogen gas and wherein the substrate is heated to bring about deposition of the film forming metal and catalysis by the catalytic metal for removal of carbon and other heteroatom contaminants as volatile hydrocarbon byproducts from the deposited metal film.

The invention process also includes the liquid phase deposition of the precursor followed by metal deposition as well as gas phase deposition, sequentially or simultaneously to control and or to tailor deposited metal films and metal admixtures. Laser induced CVD and plasma enhanced CVD are also included in the invention.

The invention also includes the improved purity metal films, especially tungsten metal films having relatively minor amounts of a catalytic metal dissolved, admixed, or alloyed therein.

Figure 1:
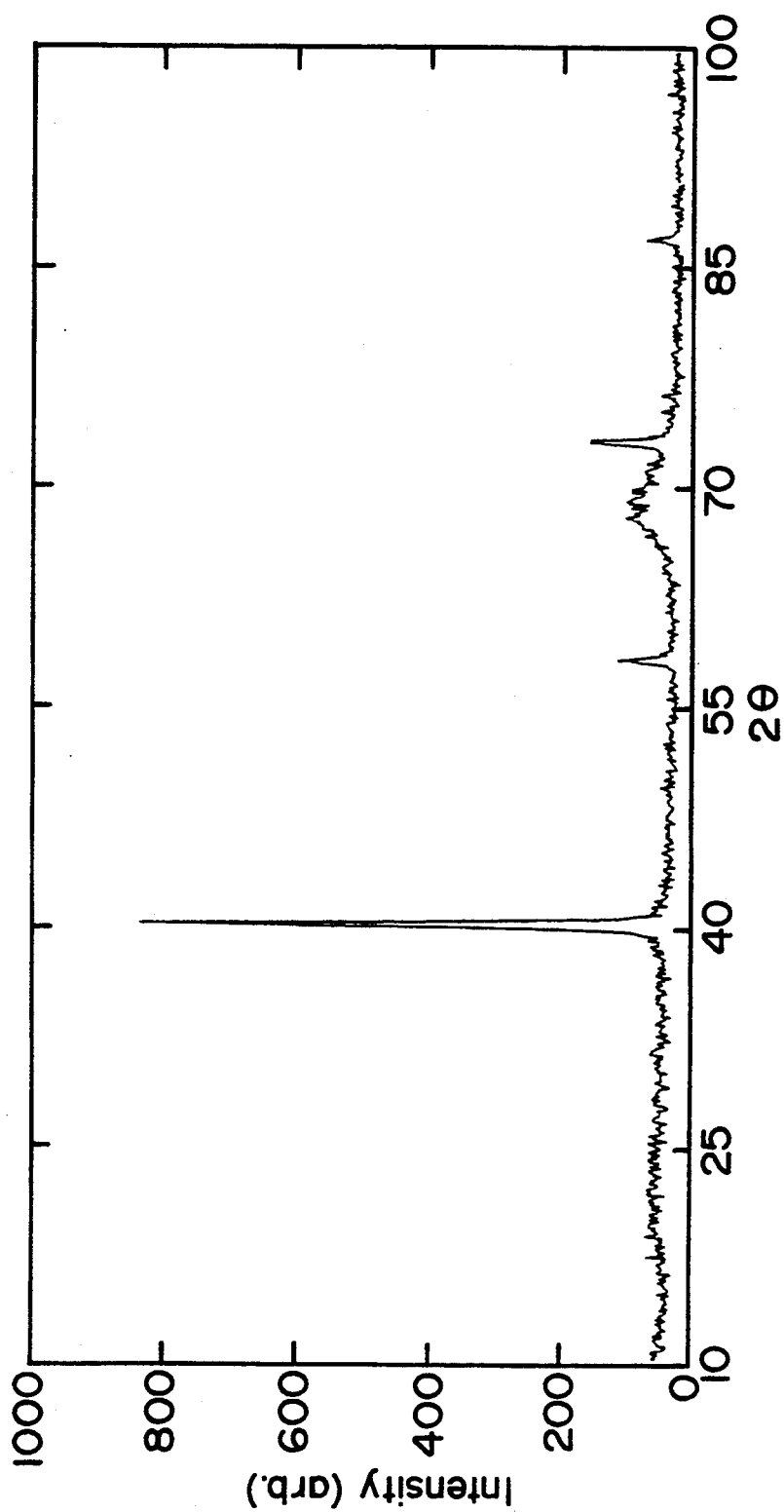
FIG. 1 shows the X-ray diffraction pattern of tungsten film deposited on silicon in accordance with the invention process.

Table 1 shows a comparison of a W/Pt film deposited according to the invention with a W film deposited according to a prior art process.

DETAILED DESCRIPTION OF THE INVENTION

It is intended that any procedure normally followed for chemical vapor deposition (CVD) or liquid vapor deposition can be used in carrying out the process of the invention. Deposition by means of laser photodeposition is also used and is an additional process element of the invention.

Preferably, a reaction chamber is used having a means for introduction of gaseous substances. If desired, the reaction chamber can be provided with a window made of a special quartz material such as Spectrosyl TM or Carbosyl TM which permits the passage of infrared light for purposes of heating of the substrate.

The reaction chamber also includes a susceptor or other support for holding the substrate onto which the tungsten is to be deposited.

The substrates, for example, can be comprised among others of glass, fused silica, sapphire (001), silicon (100) and GaAs (100). Cleaning of the substrates by degreasing, acid or other etching prepares the surface of the substrate for the deposition process by removing impurities which can interfere with the deposition process.

The process is particularly suitable for deposition of metals which are capable of resisting high temperatures and which preferentially form refractory carbides in the presence of carbon. Such metals of greatest interest include tungsten, molybdenum, niobium, and tantalum due to their low electrical resistivity. Of lesser interest are hafnium, thorium, titanium, uranium, vanadium, and zirconium due to their high electrical resistivity, although the invention process can be used advantageously to improve the purity of these and other deposited metal films for a variety of other applications.

The precursor film forming metal compounds, for example, bis(cyclopentadienyl)dihydrotungsten, $(C_5H_5)_2WH_2$, and the precursor catalytic metal compounds, for example $CpPtMe_3$ are each separately mixed with helium, argon or other inert gas preferably to the point of saturation. The two gases are then preferably mixed together, as in a manifold, prior to introduction into the reaction chamber. The use of the inert gas prevents premature decomposition, especially of the precursor catalytic metal compounds in the presence of hydrogen gas.

Alternatively, the precursor film forming metal compounds can be introduced with a stream of hydrogen gas, while the more reactive precursor catalytic metal compound is preferably introduced by a stream of inert gas.

Hydrogen gas is separately introduced into the reaction chamber, preferably near to the substrate. Excellent results have been obtained using approximately equal volume portions of the hydrogen gas and the mixture taken as a whole of the inert gas saturated with the precursor film forming metal compounds and the inert gas saturated with the precursor catalytic metal compounds.

Saturation of the inert gas is effected by passage of the inert gas over the precursor film forming metal compounds or over the precursor catalytic metal compounds.

The relative amounts of the precursor film forming metal compounds and the precursor catalytic metal compounds are controlled by the flow rates. The precursor catalytic metal compounds are included to provide up to 10 mol %, with from 0.1–5 mol % being most preferred. The exact amount will depend upon the identity of the precursor film forming metal compounds and of the precursor catalytic metal compounds used.

All of the gases are preferably directed in a stream across the surface of the substrate. The substrate is heated to and maintained at a temperature sufficiently high to cause decomposition of the precursor film forming metal compounds. The exact temperature will depend upon the identity and chemical, thermal, and stability makeup of the compounds used under the reaction conditions. A temperature of approximately 200°–400° C., has given good results using in the case of $(C_5H_5)_2WH_2$ on various substrates.

Heating of the substrate is preferably by means of an infrared lamp which is focused through the quartz window in order to specifically heat the substrate.

The precursor film forming metal compound gas mixture and the precursor catalytic metal compound gas mixture are preferably prewarmed to a temperature of approximately 60° C.

The pressure within the reaction chamber during the reaction can be ambient but is more preferably a dynamic vacuum so that the stream of gases is constantly passing over and contacting the substrate surface onto which the film forming metal such as tungsten and the catalytic metal, such as platinum are being continuously deposited.

In some cases, a preliminary surface treatment with the catalytic metal is feasible. Alternatively, the catalytic metal deposited from the catalytic metal precursor in the early part of the CVD process is sufficient to yield relatively pure metal film.

In some cases the precursor metal compound or compounds and/or the precursor catalytic metal compound can be introduced into a plasma in plasma-enhanced CVD processes.

The precursor from which the film forming metal is deposited is one or more vaporizable or soluble precursor film forming metal compounds having the formula $L_nMR_m$. The precursor film forming metal compounds is included as a major component of a gas mixture which is admixed with a minor amount of at least one vaporizable precursor catalytic metal compound having the formula $$L_nM'R_m$$

In the above formulas, L is a $\pi$-bonding organic ligand such as ethylene, allyl, methylallyl, butadienyl, pentadienyl, cyclopentadienyl, methycyclopentadienyl, cyclohexadienyl, hexadienyl, cycloheptatrienyl, or alkyl or alkyl silyl or fluorinated derivatives of such compounds having sufficient volatility of the precursor metal compound to be of utility in CVD or liquid CVD;

M is a precursor metal such as a transition metal, Ti (titanium), Zr (zirconium), Hf (hafnium), V (vanadium), Nb (niobium), Ta (tantalum), Cr (chromium), Mo (molybdenum), W (tungsten), Mn (manganese), Re (Rhenium), Fe (iron), Ru (ruthenium), Os (osmium), or a main group metal such as Al (aluminum), Ga (gallium), In (indium), Si (silicon), Ge (germanium), Sn (tin), or a lanthanide or actinide metal such as La (lanthanum), Nd (neodymium), Sm (samarium), U (uranium), Pu (plutonium);

M' is a metal selected from the group of metals that can catalyze hydrogenation and hydrogenolysis reactions of unsaturated and saturated organic ligands, L and R, to yield volatile byproducts and also can catalyze the hydrogenation of surface carbon to methane as in Fischer-Tropsch catalysis in the presence of hydrogen, and consisting among others of the Group VIII transition metals of Co (cobalt), Rh (rhodium), Ir (iridium), Ni (nickel), Pd (palladium), Pt (platinum), Fe (iron), Ru (ruthenium), and and Os (osmium);

R is a G-bonding ligand radical such as hydrogen, methyl, ethyl, n- or iso- propyl, n-, sec-, or t- butyl, benzyl, phenyl, and silylated and fluorinated derivatives having sufficient volatility or solubility of the precursor metal compound to be of utility in CVD or liquid CVD;

n is a number from 0 to the valence of said metal, m is a number from 0 to the valence of the metal, where m plus n allow a stable configuration of the precursor metal compound to allow the precursor compound to be either volatile or soluble.

Examples of the precursor film forming metal compounds include but are not limited to:

bis(cyclopentadienyl)dihydromolybdenum, $(C_5H_5)_2MoH_2$; bis(cyclopentadienyl)(ethylene)molybdenum, $(C_5H_5)_2MoC_2H_2$; tris(butadiene)molybdenum, $(C_4H_6)_3Mo$; tris(cyclobutadienyl)molybdenum, $(C_4H_4)_3Mo$; dicylopentadienyltrihydroniobium, $(C_5H_5)_2NbH_3$; bis(cyclopentadienyl)niobiumborohydride, $(C_5H_5)_2NbH_2BH_2$; bis(cyclopentadienyl)hydro(ethylene)niobium, $(C_5H_5)_2NbHC_2H_2$; bis(cyclopentadienyl)allylniobium, $(C_5H_5)_2NbC_3H_4$; pentamethyltantalum, $Ta(CH_3)_5$; bis(cyclopentadienyl)trihydrotantalum, $(C_5H_5)_2TaH_3$; bis(cyclopentadienyl)trimethyltitanium, $(C_5H_5)_2Ti(CH_3)_3$; titanocene borohydride, $(C_5H_5)_2TiH_2BH_2$; bis(cyclopentadienyl)dimethyltitanium, $(C_5H_5)_2Ti(CH_3)_2$; bis(cyclopentadienyl)methylvanadium, $(C_5H_5)_2VCH_3$; 1,1'-dimethylvanadocene, $(C_5H_4CH_3)_2V$; bis(2,4-dimethylpentadienyl)vanadium, $(C_5H_3(CH_3)_2)_2V$; bis(cyclopentadienyl)dihydrotungsten, $(C_5H_5)_2WH_2$; trisbutadienetungsten, $(C_4H_6)_3W$; hexamethyl tungsten, $(CH_3)_6W$; and bis(cyclopentadienyl)(cyclobutadiene)zirconium, $(C_5H_5)_2ZrC_4H_4$.

Examples of the precursor organocatalyst metal compound comprise among others:

$CpPtMe_3$; $CpPt(allyl)$; $CpPt(methylallyl)$; $MeCpPt(methylallyl)$; $CpPt(CO)CH_3$; $MeCpPt(CO)CH_3$; bisallylPd; (methylallyl)Pd(allyl); bis(2-methylallyl)palladium; (cyclopentadienyl)(allyl)palladium; $(CH_3C_5H_4)PtMe_3$; $(C_3H_5)_3Rh$; $(C_3H_5)_3Ir$; CpIr(hexadiene); $(C_5H_5)Ir(C_6H_8)$; $(C_5(CH_3)_5)Ir(ethylene)_2$; $(C_5H_7)Ir(C_8H_8)$; $(CH_3C_5H_4)_2Ni$; (cyclopentadienyl)(cyclohexadienyl)cobalt, $(C_5H_5)Co(C_6H_7)$; $(CH_3C_5H_4)Co(MeCp)$; $(C_5H_5)CoCp$; (cyclobutadienyl)(cyclopentadienyl)cobalt, $(C_4H_4)CoC_5H_5$; bis(cyclopentadienyl)cobalt; $(C_5H_5)_2Co$; bis(methylcyclopentadienyl)cobalt, $(CH_3C_5H_4)_2Co$; cyclopentadienyl(1,3-hexadienyl)cobalt, $(C_5H_5)CoC_6H_7$; (cyclopentadienyl)(5-methylcyclopentadienyl)cobalt, $(C_5H_5)CoC_5H_4CH_3$; $(C_5H_5)Co(CO)_2$; $(C_6H_8)CoCp$; bis(ethylene)(pentamethylcyclopentadienyl)cobalt, $((CH_3)_5C_5)Co(C_2H_2)_2$; triallylchromium, $(C_3H_4)_3Cr$; bis(cyclopentadienyl)chromium, $(C_5H_5)_2Cr$; (cycloheptatrienyl)(cyclopentadienyl)chromium, $(C_7H_7)Cr(C_5H_5)$; bis(cyclopentadienyl)iron, $(C_5H_5)_2Fe$; (2,4-cyclohexadienyl)(cyclopentadienyl)iron, $(C_6H_7)Fe(C_5H_5)$; (cyclopentadienyl)(methylcyclopentadienyl)iron, $(C_5H_5)Fe(C_5H_4CH_3)$; bis(methylcyclopentadienyl)iron, $(CH_3C_5H_4)_2Fe$; (cycloheptatrienyl)(cyclopentadienyl)manganese, $(C_5H_5)Mn(C_7H_8)$; (benzene)(cyclopentadienyl)manganese, $(C_5H_5)Mn(C_6H_6)$; ethenylosmocene, $(C_5H_5)Os(C_5H_4CHCH_2)$; 1,1'-dimethylosmocene, $(C_5H_4CH_3)_2Os$; vinylosmocene, $(C_5H_5)Os(C_5H_4CH_2CH_3)$; bis(cyclopentadienyl)hydridorhenium, $(C_5H_5)_2ReH$; hexamethylrhenium, $(CH_3)_6Re$; $HRe(CO)_5$; cyclopentadienyl(methylcyclopentadienyl)ruthenium, $(C_5H_5)Ru(C_5H_4CH_3)$; ruthenocenylacetylene, $(C_5H_5)Ru(C_5H_4CCH)$; vinylruthenocene, $(C_5H_5)Ru(C_5H_4CHCH_2)$; bis(methylcyclopentadienyl)ruthenium, $Ru(CH_3C_5H_4)_2$; ethylruthenocene, $(C_5H_5)Ru(C_5H_4CH_2CH_3)$.

Examples of the preferred precursor film forming metal compounds include:

bis(cyclopentadiene)dihydrotungsten, $(C_5H_5)_2WH_2$; trisbutadienetungsten, $(C_4H_6)_3W$.

The preferred precursor catalytic metal compounds are:

$CpPtMe_3$ or $MeCpPtMe_3$.

By the term "soluble" as used herein and in the appended claims is meant to have sufficient solubility to enable the precursor compound to be dissolved in an organic solvent. Examples of such organic solvents includes among others hexane, cyclohexane, tetrahydrofuran, 1,2-dimethoxyethane, acetonitrile, and the like.

The solution is applied to the surface of the substrate and the solvent removed by evaporation. Thermal heating and/or laser induced decomposition in the presence of hydrogen gas and the catalytic metal causes the metal film to be formed.

The precursor film forming metal compounds for metal film forming are included in major amounts with relatively minor amounts of the precursor catalytic metal compounds. With respect to the amount of the precursor catalytic metal compounds, there can be included up to about 10 mol %.

The invention will be more easily understood by reference to the following examples which are presented for the purpose of illustrating the invention and are in no way intended to constitute a limitation thereof.

EXAMPLE 1

PREPARATION OF PRECURSOR FILM FORMING METAL COMPOUNDS AND PRECURSOR CATALYTIC METAL COMPOUNDS

The following precursor film forming metal compounds and precursor catalytic metal compounds were prepared:
(a) $CpPtMe_3$
(b) $(CH_3C_5H_4)PtMe_3$
(c) $(C_3H_5)_3Rh$
(d) $(C_3H_5)_3Ir$
(e) $HRe(CO)_5$
(f) $(CH_3C_5H_4)_2Ni$
(g) $(C_5H_5)_2CoCP$
(h) $(C_5H_5)Co(C_6H_7)$;
(i) $(CH_3C_5H_4)Co(MeCp)$;
where Cp is cyclopentadienyl; Me is methyl; $(C_6H_7)$ is cyclohexadiene; and MeCp is methylcyclopentadiene.

Compound (a) was prepared from $PtMe_3I$ and NaCp using the procedure described in Robinson, S. and Shaw, B., *J. Chem. Soc.*, 277, 1529 (1965), except that toluene was used instead of benzene as the solvent, and the reaction was started at $-77°$ C. The yield obtained was 52%. Compound (a) was also obtained using the Robinson and Shaw procedure.

Compound (b) was prepared as follows: 445 mg $PtMe_3I$ in 25 ml ethyl ester dried over potassium and benzene was added dropwise at $-78°$ C. under nitrogen to 1.5 ml of approximately 1.1 M MeCpNa. The solution was slowly raised back to room temperature over 12 hours while stirring. Ethyl ether and THF were removed at $-20°$ to $-30°$ C., leaving an oily residue that sublimed at room temperature. A cold finger at $-15°$ C. gave 62 mg of a yellow compound. The residue was extracted with pentane and filtrated in air. The pentane was removed at $-20°$ C.

Compound (c) was prepared as follows: 100 mg $RhCl_3$ anhydrous was stirred in 50 ml ethyl ether dried over potassium and benzophenone and added to a ten times excess of allylMgCl (2.0 M in THF (Aldrich)). After stirring for 12 hours, dry ice was added to the decomposed excess allylMgCl, and the mixture was dried under vacuum at $-15°$ C. Pentane was then used to exhaust the residue and pentane was removed at about 5 degrees centigrade by water evaporation. After sublimation (cold finger at temperature of running water, flask at room temperature), a yellow solid formed on the cold finger.

Compound (d) was prepared as follows: 0.200 g $IrCl_3$ in 4 ml toluene was dried and added dropwise under argon gas to 3.4 ml of 2M allylMgCl in THF (Aldrich) at $-78$ degrees C. The black $IrCl_3$ remained undissolved. The solution was then raised to room temperature and heated on a water bath to 50° C. for 10 hours. The solution was dark and no precipitate formed. A few lumps of dry ice were added to destroy any remaining Grignard reagent. Solvent was removed at 0° C. under $10^{-2}$ torr vacuum. 50 ml pentane was used to extract the product from the raw product, and the pentane was removed at 15°-20° C. and $10^{-2}$ torr to give the crude product. The crude product was then purified by sublimation at 15 torr and 50° C. with a cold finger at 10° C. for about 30 minutes.

Compounds (e) to (i) were prepared using similar procedures.

EXAMPLE 2

DEPOSITION OF TUNGSTEN IN THE PRESENCE OF HYDROGEN AND AN ORGANOPLATINUM CATALYST

The reaction materials were prepared from precursors. The organotungsten compound, $Cp_2WH_2$ was prepared from $WCl_6$ following the procedure outlined by M. L. H. Green, J. A. McCleverty, L. Pratt and G. Wilkinson, J. Chem. Soc., 4854 (1961); see also *Organometallic Syntheses*, J. J. Eisch and R. B. King, Eds., Vol. 1, Transition Metal Compounds, R. B. King, Ed. (Academic Press, New York, N.Y., 1965) 79.

The precursor $CpPtMe_3$ was prepared from $K_2PtCl_6$ according to the method described by Z. Xue, H. Thridandam, H. D. Kaesz and R. F. Hicks, Chem. Mater., 4, 162 (1992). Alternatively, the $CpPtMe_3$ can be purchased directly from Strem Chemical Company, Newburyport, Mass.

The reaction chamber was comprised of a glass tube having a diameter of 2.5 cm. The tungsten was deposited on both glass and silicon (100) substrates. Prior to deposition, the glass was washed in ethylene chloride and methanol, rinsed in deionized water, and dried in air. The silicon wafers were similarly prepared but deionized after water rinsing, also included etching for 10 seconds in 10% by volume hydrofluoric acid, rinsing again in water, and then drying in air.

The substrate was placed within the glass tube. The section of the tube containing the substrate which was about 3 cm long, was heated to 380°±20° C. by means of heating tape wrapped uniformly around the tube.

The $Cp_2WH_2$ was placed 5 cm upstream of the substrate and was heated to 100°-150° C. by a resistance heater located directly underneath the tube. At these temperatures the vapor pressure of $Cp_2WH_2$ is $\sim 0.01$ Torr. During the deposition period, hydrogen was fed at 8 cm$^3$/min, and argon was fed at 16 cm$^3$/min. The argon was passed through a glass frit containing $CpPtMe_3$ at 23° C. so that the argon became saturated with 0.045 Torr of the precursor catalytic metal compound.

The argon and the hydrogen were purified prior to reaction by passing through a deoxygenating catalyst (OXYSORB TM, Altec Associates, Inc.) and 13X molecular sieves. The relative ratios or percentages by volume of the $Cp_2WH_2$ and $CpPtMe_3$ were 90/10 mol %. The gases were flowed over the substrate for a period ranging from 6 to 20 hours.

Using the silicon (100) substrates, it was found that tungsten decomposed more readily than on the glass substrates. For example, the glass surface was covered with a transparent brown layer of material after 6 hours of deposition. After the same amount of time, the silicon was covered with a uniform, highly reflective metal film.

It was estimated that the growth rate of the films was between 0.05 and 0.15 Å/s. The films exhibited excellent adherence to the silicon as demonstrated by the fact that they could not be removed by cellophane tape application.

The structure and composition of the deposited W/Pt films were analyzed by X-ray diffraction, scanning electron microscopy, and Auger electron spectroscopy with depth profiling. A 4-point probe was used to determine the sheet resistivity and a depth profiling measurement yielded the thickness of the films deposited.

It was found that the deposited films are amorphous and comprised of 100–500 Å clusters as shown by scanning electron micrographs. It was also found that the clusters could be converted into microcrytallites by annealing in hydrogen at 750° C.

Figure 2:
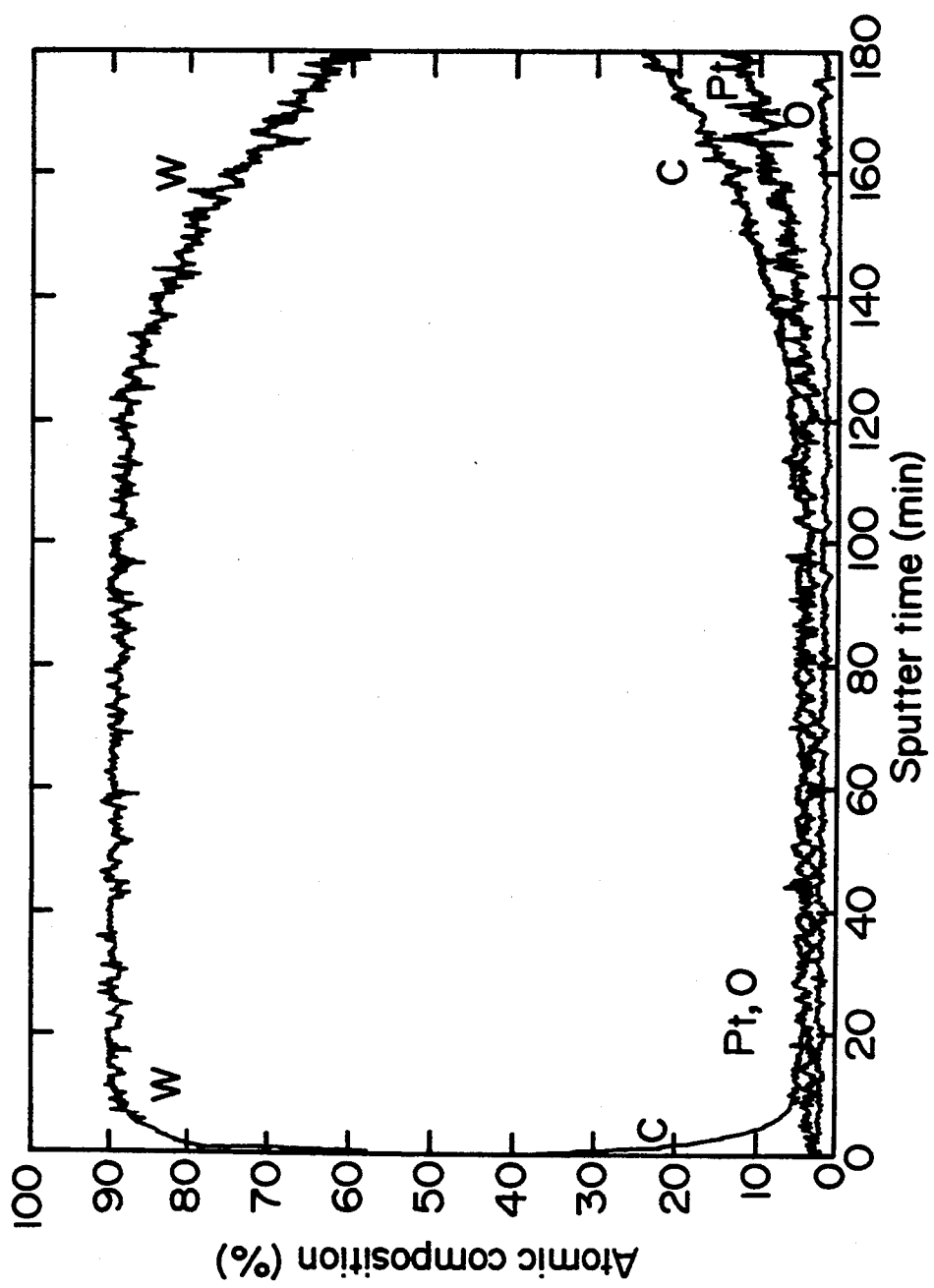
FIG. 2 shows an Auger depth profile of a deposited W/Pt film.

FIG. 2 shows an Auger depth profile of the W/Pt film. The bulk film is sputtered from 20 to 140 minutes after which the Si signal appears due to sputtering of the silicon substrate. FIG. 2 does not show the atomic contribution from the silicon. The film produced was found to contain 89.6% W, 3.3% Pt, 5.3% C, and 1.8% O. It is believed that this is the highest purity tungsten film ever produced from the thermal decomposition of an organotungsten precursor.

It is believed that the high purity is a consequence of the catalytic hydrogenation and hydrogenolysis of the hydrocarbon ligands by the codeposited platinum.

The above results demonstrate that increased purity of tungsten films can be effected by including small amounts of CpPtMe to improve the purity of transition metal films obtained by chemical vapor deposition of precursor film forming metal compounds.

EXAMPLE 3

DEPOSITION OF TUNGSTEN FROM ORGANOTUNGSTEN IN THE ABSENCE OF A PRECURSOR CATALYST METAL COMPOUND

This example is presented for purposes of comparison only and is not in accordance with the process of the invention.

The procedure of Example 2 was repeated except that tungsten was deposited from $Cp_2WH_2$ in the presence of hydrogen but without the presence of an organoplatinum catalyst.

Hydrogen was fed to the reactor upstream of the precursor at 2 cm$^3$/min (at 20° C.).

X-ray diffraction, scanning electron microscopy, and Auger electron spectroscopy with depth profiling was also used to analyze the structure and composition of the W films deposited. A four-point probe was used to measure sheet resistivity and film thickness was determined with depth profiling measurements.

The film thickness was 1,450 Å.

FIG. 1 shows the X-ray diffraction pattern of tungsten film deposited on silicon (100) after annealing in hydrogen at 750° C. for 2½ hours. As shown, the sharp lines near $2\theta = 40°, 58°, 73°$, and 87° are due to W metal. A silicon substrate shows a broad peak at 69°. No peaks were found for tungstensilicide.

It was found that the sheet resistivity of the unannealed W films averaged 54±4 μΩ.cm. This is compared with the value for bulk tungsten metal of 5.6 μΩ.cm. It is believed that the high resistivity is probably due to the amorphous nature of the deposit as well as the poor contact between adjacent metal clusters.

Table 1 shown below compares the compositions of W/Pt films deposited according to example 2 and W films deposited according to example 3.

An examination of Table 1 indicates that when tungsten is deposited without the organoplatinum catalyst, the composition of the film is 71.8% W, 25.1% C, and 3.1% O. Thus, there is significantly decreased carbon contamination (25.1% C compared to 5.3% C) and decreased contamination with oxygen (3.1% O compared to 1.8% O) when the precursor catalytic metal compound is codeposited with the tungsten precursor.

These results demonstrate the advantage of including small amounts of $CpPtMe_3$ or equivalent precursor catalytic metal compounds for codeposition to enhance the purity of transition metal films obtained by chemical vapor deposition.

EXAMPLE 4

LASER PHOTODEPOSITION

Using the reaction chamber substantially as described in Example 3, glass, silicon, fused silica, sapphire (001), and GaAs (100) substrates are deposited with tungsten using $Cp_2WH_2$ and $CpPtMe_3$ in the presence of hydrogen.

The substrates are prepared in the same manner as described in Example 3.

A stream of argon gas is separately passed over crystals of $Cp_2WH_2$ and over crystals of $CpPtMe_3$ to saturate the argon gas with the respectively compounds.

Hydrogen gas is introduced into the reaction chamber in proximity to a laser beam, and gas flow is parallel to the surface of the substrate.

All photolyses are carried out at atmospheric pressure with the laser beam perpendicular to the surface. An alternative deposition using the laser beam parallel to the surface to induce a gas phase reaction that surface deposits metal can also be used as well as laser beam deposition at angles between parallel and perpendicular to the surface.

The laser is a 308 nm line of a XeCl excimer laser or the 351 and 364 nm lines of an argon ion laser.

The deposition is first carried out by irradiating a circle 1 mm in diameter with 2.6 mJ/pulse at 10 Hz using the 308 nm band. Visible mirrors are formed on the substrates in about 10 minutes. The deposited films have a thickness of about 1000 angstroms.

Photodeposition is carried out under CW conditions with fluences of 4–5 mW/mm$^2$ at laser wave lengths of 351 and 364 nm. Using the same flow rates, mirror-like deposits are observed in about 10 minutes.

Analysis of the films using Auger electron spectroscopy showed substantially the same pure films as obtained following the process of Example 3.

The substrate is patterned using a mask and a 40 mm lens for the laser. The image is focussed below the surface of the substrate in order to minimize the focus, and hence deposition, on the cell windows. Successful patterned depositions are obtained.

Laser induced and plasma enhanced metal deposition can also be used in combination with various combinations of gas phase CVD and liquid CVD as above described.

Various modifications of the invention are contemplated which will be obvious to those skilled in the art and which can be resorted to without departing from the spirit and scope of the invention as defined in the following appended claims.

We claim:
1. A process for the chemical vapor deposition of at least one metal onto a substrate comprising:
   a) exposing said substrate to a fluid mixture containing a major amount of at least one vaporizable or soluble precursor film forming metal compound having the formula

$L_nMR_m$ and to a fluid containing a minor amount of at least one vaporizable or soluble precursor catalytic metal compound having the formula $L_nM'R_m$ wherein L is a $\pi$-bonding organic ligand consisting of ethylene, allyl, methylallyl, butadienyl, pentadienyl, cyclopentadienyl, methycyclopentadienyl, cyclohexadienyl, hexadienyl, cycloheptatrienyl, or alkyl or alkyl silyl or fluorinated derivatives of said precursor catalytic metal compounds having sufficient volatility of the precursor metal compound to be of utility in gaseous CVD or liquid CVD;
   M is a precursor metal consisting of a transition metal, Ti (titanium), Zr (zirconium), Hf (hafnium), V (vanadium), Nb (niobium), Ta (tantalum), Cr (chromium), Mo (molybdenum), W (tungsten), Mn (manganese), Re (Rhenium), Fe (iron), Ru (ruthenium), Os (osmium), or a main group metal consisting of Al (aluminum), Ga (gallium), In (indium), a group 4a element consisting of Si (silicon), Ge (germanium), Sn (tin), or a lanthanide or actinide metal consisting of La (lanthanum), Nd (neodymium), Sm (samarium), U (uranium), Pu (plutonium;
   M' is a metal selected from the group of metals that can catalyze hydrogenation and hydrogenolysis reactions of unsaturated and saturated organic ligands, L and R, to yield volatile byproducts and also can catalyze the hydrogenation of surface carbon to methane in the presence of hydrogen, and consisting of the Group VIII transition metals of Co (cobalt), Rh (rhodium), Ir (iridium), Ni (nickel), Pd (palladium), Pt (platinum), Fe (iron), Ru (ruthenium), and Os (osmium);
   R is a $\sigma$-bonding ligand radical consisting of hydrogen, methyl, ethyl, n- or iso- propyl, n-, sec-, or t-butyl, benzyl, phenyl, and silylated and fluorinated derivatives having sufficient volatility or solubility of the precursor metal compound to be of utility in CVD or liquid CVD;
   n is a number from 0 to the valence of said metal,
   m is a number from 0 to the valence of the metal, where m plus n allow a stable configuration of the precursor metal compound to allow the precursor compound to be either volatile or soluble in an organic solvent;
   (b) exposing said substrate to hydrogen gas; and
   (c) maintaining said substrate throughout the reaction at a temperature sufficiently high to decompose said precursor film forming metal compounds and said precursor catalytic metal compounds;
   (d) reacting said precursor film forming metal compound and said precursor catalytic metal compound in the presence of hydrogen gas in a manner to cause decomposition of precursor metal compound $L_nMR_m$, and of the catalyst metal compound $L_nM'R_m$ on the surface of said substrate to form on said surface a metal film M containing catalytic metal M' without causing substantial impurities from the ligands of said precursor compounds to be formed on said surface and incorporated on or within said metal film.

2. A process according to claim 1 wherein said precursor catalytic metal compounds $L_nM'R_m$ comprise 0.1 to 10 mol % relative to said precursor film forming compounds $L_nMR_m$ and both being introduced in a stream of inert gas.

3. A process according to claim 1 wherein said precursor film forming metal compounds comprise:
bis(cyclopentadienyl)dihydromolybdenum, $(C_5H_5)_2MoH_2$; bis(cyclopentadienyl)(ethylene)molybdenum, $(C_5H_5)_2MoC_2H_2$; tris(butadiene)molybdenum, $(C_4H_6)_3Mo$; tris(cyclobutadieny)molybdenum, $(C_4H_4)_3Mo$; dicyclopentadienyltrihydroniobium, $(C_5H_5)_2NbH_3$; bis(cyclopentadienyl)niobiumborohydride, $(C_5H_5)_2NbH_2BH_2$; bis(cyclopentadienyl)hydro(ethylene)niobium, $(C_5H_5)_2NbHC_2H_2$; bis(cyclopentadienyl)allylniobium, $(C_5H_5)_2NbC_3H_4$; pentamethyltantalum, $Ta(CH_3)_5$; bis(cyclopentadienyl)trihydrotantalum, $(C_5H_5)_2TaH_3$; bis(cyclopentadienyl)trimethyltitanium, $(C_5H_5)_2Ti(CH_3)_3$; titanocene borohydride, $(C_5H_5)_2TiH_2BH_2$; bis(cyclopentadienyl)dimethyltitanium, $(C_5H_5)_2Ti(CH_3)_2$; bis(cyclopentadienyl)methylvanadium, $(C_5H_5)_2VCH_3$; 1,1'-dimethylvanadocene, $(C_5H_4CH_3)_2V$; bis(2,4-dimethylpentadienyl)vanadium, $(C_5H_3(CH_3)_2)_2V$; bis(cyclopentadienyl)dihydrotungsten, $(C_5H_5)_2WH_2$; trisbutadienetungsten, $(C_4H_6)_3W$; hexamethyl tungsten, $(CH_3)_6W$; and bis(cyclopentadienyl)(cyclobutadiene)zirconium, $(C_5H_5)_2ZrC_4H_4$.

4. A process according to claim 1 wherein said precursor catalytic metal compounds comprise:
CpPtMe$_3$; CpPt(allyl); CpPt(methylallyl); MeCpPt(methylallyl); CpPt(CO)CH$_3$; MeCpPt(CO)CH$_3$; bisallylPd; (methylallyl)Pd(allyl); bis(2-methylallyl)palladium; (cyclopentadienyl)(allyl)palladium; $(CH_3C_5H_4)PtMe_3$; $(C_3H_5)_3Rh$; $(C_3H_5)_3Ir$; CpIr(hexadiene); $(C_5H_5)Ir(C_6H_8)$; $(C_5(CH_3)_5)Ir(ethylene)_2$; $(C_5H_7)Ir(C_8H_8)$; $(CH_3C_5H_4)_2Ni$; (cyclopentadienyl)(Cyclohexandienyl)cobalt, $(C_5H_5)Co(C_6H_7)$; $(CH_3C_5H_4)Co(MeCp)$; $(C_5H_5)CoCp$; (cyclobutadienyl)(cyclopentadienyl)cobalt, $(C_4H_4)Co(C_5H_5)$; bis(cyclopentadienyl)cobalt; $(C_5H_5)_2Co$; bis(methylcyclopentadienyl)cobalt, $(CH_3C_5H_4)_2Co$; cyclopentadienyl(1,3-hexadienyl)cobalt, $(C_5H_5)Co(C_6H_7)$; (cyclopentadienyl)(5-methyl-cyclopentadienyl)cobalt, $(C_5H_5)Co(C_5H_4CH_3)$; $(C_5H_5)Co(CO)_2$; $(C_6H_8)CoCp$; bis(ethylene)s(pentamethylcyclopentadienyl)cobalt, $((CH_3)_5C_5)Co(C_2H_2)_2$; triallylchromium, $(C_3H_4)_3Cr$; bis(cyclopentadienyl)chromium, $(C_5H_5)_2Cr$; (cycloheptatrienyl)(cyclopentadienyl)chromium, $(C_7H_7)Cr(C_5H_5)$; bis(cyclopentadienyl)iron, $(C_5H_5)_2Fe$; (2,4-cyclohexadienyl)(cyclopentadienyl)iron, $(C_6H_7)Fe(C_5H_5)$; (cyclopentadienyl)(methylcyclopentadienyl)iron, $(C_5H_5)Fe(C_5H_4CH_3)$; bis(methylcyclopentadienyl)iron, $(CH_3C_5H_4)_2Fe$; (cycloheptatrienyl)(cyclopentadienyl) manganese, $(C_5H_5)Mn(C_7H_8)$; (benzene)(cyclopentadienyl)manganese, $(C_5H_5)Mn(C_6H_6)$; vinylosmocene, $(C_5H_5)Os(C_5H_4CHCH_2)$; 1,1'-dimethylosmocene, $(C_5H_4CH_3)_2Os$; ethylosmocene, (C$_5$H$_5$)Os(C$_5$H$_4$CH$_2$CH$_3$); bis(cyclopentadienyl)hydridorhenium, (C$_5$H$_5$)$_2$ReH; hexamethylrhenium, (CH$_3$)$_6$Re; HRe(CO)$_5$; cyclopentadienyl(methylcyclopentadienyl)ruthenium, (C$_5$H$_5$)Ru(C$_5$H$_4$CH$_3$); ruthenocenylacetylene, (C$_5$H$_5$)Ru(C$_5$H$_4$CCH); vinylruthenocene, (C$_5$H$_5$)Ru(C$_5$H$_4$CHCH$_2$); bis(methylcyclopentadienyl)ruthenium, Ru(CH$_3$C$_5$H$_4$)$_2$; ethylruthenocene, (C$_5$H$_5$)Ru(C$_5$H$_4$CH$_2$CH$_3$).

5. A process according to claim 1 wherein said precursor film forming metal compounds comprise: bis(cyclopentadienyl)dihydrotungsten, (C$_5$H$_5$)$_2$WH$_2$, or trisbutadienetungsten, (C$_4$H$_6$)$_3$W.

6. A process according to claim 1 further comprising: annealing said deposited metal films to convert the metal films into a dense mat of small crystallites.

7. A process according to claim 1 wherein said precursor catalytic metal compound is CpPtMe$_3$ or MeCpPtMe$_3$.

8. A process according to claim 1 wherein said precursor catalytic metal compounds and said precursor film forming metal compounds are each mixed with an inert gas prior to introduction into said reaction chamber and wherein said precursor catalytic metal compounds/inert gas mixture, said precursor film forming metal compounds/inert gas mixture, and said hydrogen gas are directed in a continuous stream over said substrate.

9. A process according to claim 8 wherein said inert gas is mixed with said precursor catalytic metal compounds and with said precursor film forming metal compounds by separately passing a stream of said inert gas over each of said compounds to saturate said inert gas with said precursor catalytic metal compounds and with said precursor film forming metal compounds.

10. A process according to claim 1 wherein said substrate is heated to a temperature in the range of about 180° C. to about 400° C. and said reaction gases are at a temperature in the range of ambient to about 150° C.

11. A process according to claim 1 wherein said substrate is comprised of a substance stable to the temperature and partial pressure of hydrogen and the temperature of the process.

12. A process according to claim 1 wherein two different precursor film forming metal compounds as defined in step (a) are included in the process to provide an alloy or mixture of two different metals having residual amounts of the catalytic metal deposited within the metal alloy or mixture.

13. A process according to claim 1 in which two or more different metals are deposited onto a substrate in a sequential process by following steps (a), (b), (c), and (d) to deposit the first layer of metal having a minor amount of the catalytic metal therein and then subsequently depositing another different metal on the first metal by repeating steps (a), (b), (c), and (d) of claim 1 until the total number of deposited metal layers has been formed.

14. A process for depositing at least one film of a metal onto a substrate comprising:

a) exposing said substrate to a gas or liquid mixture containing a major amount of at least one vaporizable or soluble precursor film forming metal compound having the formula $$L_nMR_m$$

and to a fluid containing a minor amount of at least one vaporizable or soluble precursor catalytic metal compound having the formula $$L_nM'R_m$$

wherein L is a $\pi$-bonding organic ligand consisting of ethylene, allyl, methylallyl, butadienyl, pentadienyl, cyclopentadienyl, methycyclopentadienyl, cyclohexadienyl, hexadienyl, cycloheptatrienyl, or alkyl or alkyl silyl or fluorinated derivatives of said precursor catalytic metal compounds having sufficient volatility of the precursor metal compound to be of utility in CVD or liquid CVD;

M is a precursor metal consisting of a transition metal, Ti (titanium), Zr (zirconium), Hf (hafnium), V (vanadium), Nb (niobium), Ta (tantalum), Cr (chromium), Mo (molybdenum), W (tungsten), Mn (manganese), Re (Rhenium), Fe (iron), Ru (ruthenium), Os (osmium), or a main group metal such as Al(aluminum), Ga (gallium), In (indium), a group 4a element consisting of Si (silicon), Ge (germanium), Sn (tin), or a lanthanide or actinide metal consisting of La (lanthanum), Nd (neodymium), Sm (samarium), U (uranium), Pu (plutonium;

M' is a metal selected from the group of metals that can catalyze hydrogenation and hydrogenolysis reactions of unsaturated and saturated organic ligands, L and R, to yield volatile byproducts and also can catalyze the hydrogenation of surface carbon to methane in the presence of hydrogen, and consisting of the Group VIII transition metals of Co (cobalt), Rh (rhodium), Ir (iridium), Ni (nickel), Pd (palladium), Pt (platinum), Fe (iron), Ru (ruthenium), and Os (osmium);

R is a $\sigma$-bonding ligand radical consisting of hydrogen, methyl, ethyl, n- or iso- propyl, n-, sec-, or t-butyl, benzyl, phenyl, and silylated and fluorinated derivatives having sufficient volatility or solubility of the precursor metal compound to be of utility in CVD or liquid CVD;

n is a number from 0 to the valence of said metal, m is a number from 0 to the valence of the metal, where m plus n allow a stable configuration of the precursor metal compound to allow the precursor compound to be either volatile or soluble in an organic solvent;

(b) exposing said substrate to hydrogen gas; and (c) exposing said substrate to irradiation from a laser beam at a wavelength sufficient to cause said precursor film forming metal compounds and said precursor catalytic metal compounds to react with said hydrogen gas; and, (d) depositing said metal films on the surface of said substrate without causing substantial heteroatom impurities from the organic portion of said precursor film forming metal compounds or from said precursor catalytic metal compounds to be formed on said surface.

15. A process according to claim 14 wherein step (c) comprises exposing said substrate to irradiation from a laser beam disposed at an incident angle from perpendicular to parallel to said substrate surface and at a wavelength sufficient to cause one or both of said precursor film forming metal compounds and said precursor catalytic metal compounds to react in the gas phase and in proximity to said substrate to react with said hydrogen on the substrate surface and deposit said metal film on the surface of said substrate.

16. A process according to claim 14 in which two or more different metals are deposited onto a substrate in a sequential process by following steps (a), (b), (c), and (d) to deposit the first layer of metal having a minor amount of the catalytic metal therein and then subsequently depositing another different metal on the first metal by repeating steps (a), (b), (c), and (d) of claim 1 until the total number of deposited metal layers has been formed.

17. A process according to claim 14 wherein one or more of the precursor metal compounds are selectively deposited to form a pattern.

18. In a process for depositing a metal film from a vaporizable or soluble precursor compound containing a metal to be deposited onto a substrate in the presence of hydrogen gas, the improvement which comprises:

exposing said substrate simultaneously or sequentially to at least one vaporizable or soluble precursor compound containing a metal which can be deposited as a metal film and a metal which can catalyze hydrogenation and hydrogenolysis reactions of unsaturated and saturated organic ligands to yield volatile byproducts and which can also catalyze the hydrogenation of surface carbon to methane in the presence of hydrogen to cause the metal from the catalyst compound to be incorporated within the deposited metal film as a dissolved portion, alloy, or at the metal surface, or at grain boundaries.

19. A process for controlling the amount of carbon in particular and oxygen in metal films produced by chemical vapor deposition on substrates comprising:

a) exposing said substrate to a fluid mixture containing a major amount of two or more vaporizable or soluble precursor film forming metal compounds having the formula

and to a fluid containing a minor amount of at least one vaporizable or soluble precursor catalytic metal compound having the formula

wherein L is a $\pi$-bonding organic ligand consisting of ethylene, allyl, methylallyl, butadienyl, pentadienyl, cyclopentadienyl, methycyclopentadienyl, cyclohexadienyl, hexadienyl, cycloheptatrienyl, or alkyl or alkyl silyl or fluorinated derivatives of said compounds having sufficient volatility of the precursor metal compound to be of utility in CVD or liquid CVD;

M is a precursor metal consisting of a transition metal, Ti (titanium), Zr (zirconium), Hf (hafnium), V (vanadium), Nb (niobium), Ta (tantalum), Cr (chromium), Mo (molybdenum), W (tungsten), Mn (manganese), Re (Rhenium), Fe (iron), Ru (ruthenium), Os (osmium), or a main group metal consisting of Al (aluminum), Ga (gallium), In (indium), Si (silicon), Ge (germanium), Sn (tin), or a lanthanide or actinide metal consisting of La (lanthanum), Nd (neodymium), Sm (samarium), U (uranium), Pu (plutonium);

M' is a metal selected from the group of metals that can catalyze hydrogenation and hydrogenolysis reactions of unsaturated and saturated organic ligands, L and R, to yield volatile byproducts and also can catalyze the hydrogenation of surface carbon to methane in the presence of hydrogen, and consisting of the Group VIII transition metals of Co (cobalt), Rh (rhodium), Ir (iridium), Ni (nickel), Pd (palladium), Pt (platinum), Fe (iron), Ru (ruthenium), and Os (osmium);

R is a $\sigma$-bonding ligand radical consisting of methyl, ethyl, n- or iso- propyl, n-, sec-, or t- butyl, benzyl, phenyl, and silylated and fluorinated derivatives having sufficient volatility or solubility of the precursor metal compound to be of utility in CVD or liquid CVD;

n is a number from 0 to the valence of said metal, m is a number from 0 to the valence of the metal, where m plus n allow a stable configuration of the precursor metal compound to allow the precursor compound to be either volatile or soluble;

(b) exposing said substrate to hydrogen gas; and (c) maintaining said substrate throughout the reaction at a temperature sufficiently high to decompose said precursor film forming metal compounds and said precursor catalytic metal compounds;

(d) reacting said precursor film forming metal compounds and said precursor catalytic metal compounds in the presence of hydrogen gas in a manner to cause deposition of metals M from said two or more precursor film forming metal compounds, and of the catalyst metal M' from said precursor catalytic metal compounds on the surface of said substrate without causing substantial impurities from the organic portion of said precursor film forming metal compounds or of said precursor catalytic metal compounds to be formed on said surface and to be incorporated within said metal M layer.

20. A process according to claim 19 wherein M in each of said two or more precursor film forming metal compounds is different.

21. A process according to claim 19 wherein M in each of said two or more separate precursor film forming metal compounds is the same.

22. A process according to claim 19 wherein said deposition steps are simultaneous.

23. A process according to claim 19 wherein said deposition steps are sequential.

24. In a process for plasma-enhanced CVD of metal films wherein controlled amounts of one or more precursor film forming metal compounds in gaseous form are introduced into a reaction chamber in the vicinity of a heated substrate and wherein said precursor film forming metal compounds in gaseous form are exposed to a means for activating and sustaining a plasma contained and fed by said precursors in gaseous form, to cause deposition of a metal film on said substrate, the improvement which comprises:

adding controlled amounts of hydrogen gas and of at least one vaporizable precursor catalytic metal compound containing a metal which can catalyze hydrogenation and hydrogenolysis reactions of unsaturated and saturated organic ligands to yield volatile byproducts and which can also catalyze the hydrogenation of surface carbon to methane in the presence of hydrogen to cause the metal from the precursor catalytic metal compound to be incorporated within the deposited metal film as a dissolved portion, alloy, or at the metal surface, or at grain boundaries.

25. A process for the deposition of metal films of enhanced purity which comprises:
(a) forming a solution of a precursor catalytic metal compound having the formula;

$L_nM'R_m$ (b) wetting the surface of a substrate with said solution;
(c) evaporating solvent from said solution on said surface;
(d) heating said substrate in the presence of hydrogen gas to cause decomposition of said precursor catalytic metal compound and cause deposition of catalytic metal M' on the surface of said substrate without causing substantial impurities from the heteroatom portion of said precursor catalytic metal compound to be formed on said surface;
(e) exposing said substrate having said catalytic metal M' thereon to a fluid mixture containing at least one vaporizable or soluble precursor film forming metal M compound having the formula $L_nMR_m$ wherein L is a $\pi$-bonding organic ligand consisting of ethylene, allyl, methylallyl, butadienyl, pentadienyl, cyclopentadienyl, methycyclopentadienyl, cyclohexadienyl, hexadienyl, cycloheptatrienyl, or alkyl or alkyl silyl or fluorinated derivatives of said compounds having sufficient volatility of the precursor metal compound to be of utility in CVD or liquid CVD;
M is a precursor metal consisting of a transition metal, Ti (titanium), Zr (zirconium), Hf (hafnium), V (vanadium), Nb (niobium), Ta (tantalum), Cr (chromium), Mo (molybdenum), W (tungsten), Mn (manganese), Re (Rhenium), Fe (iron), Ru (ruthenium), Os (osmium), or a main group metal consisting of Al(aluminum), Ga (gallium), In (indium), a group 4a element comprising Si (silicon), Ge (germanium), Sn (tin), or a lanthanide or actinide metal consisting of La (lanthanum), Nd (neodymium), Sm (samarium), U (uranium), Pu (plutonium;
M' is a metal selected from the group of metals that can catalyze hydrogenation and hydrogenolysis reactions of unsaturated and saturated organic ligands, L and R, to yield volatile byproducts and also can catalyze the hydrogenation of surface carbon to methane in the presence of hydrogen, and consisting of the Group VIII transition metals of Co (cobalt), Rh (rhodium), Ir (iridium), Ni (nickel), Pd (palladium), Pt (platinum), Fe (iron), Ru (ruthenium), and Os (osmium);
R is a $\sigma$-bonding ligand radical consisting of hydrogen, methyl, ethyl, n- or iso- propyl, n-, sec-, or t-butyl, benzyl, phenyl, and silylated and fluorinated derivatives having sufficient volatility or solubility of the precursor metal compound to be of utility in CVD or liquid CVD;
n is a number from 0 to the valence of said metal,
m is a number from 0 to the valence of the metal, where m plus n allow a stable configuration of the precursor metal compound to allow the precursor compound to be either volatile or soluble in an organic solvent;
(f) exposing said substrate to hydrogen gas; and
(g) maintaining said substrate throughout the reaction at a temperature sufficiently high to decompose said precursor metal compounds;
(h) reacting said precursor metal compound in the presence of hydrogen gas in a manner to cause deposition of metal M, on the surface of said substrate without causing substantial impurities from the organic portion of said precursor film forming metal compound or of said precursor catalytic metal compound to be formed on said surface and incorporated within said metal M layer.

* * * * *